(12) United States Patent
Mignot et al.

(10) Patent No.: US 10,748,823 B2
(45) Date of Patent: Aug. 18, 2020

(54) EMBEDDED ETCH RATE REFERENCE LAYER FOR ENHANCED ETCH TIME PRECISION

(71) Applicant: INTERNATIONAL BUSINESS MACHINES CORPORATION, Armonk, NY (US)

(72) Inventors: Yann Mignot, Slingerlands, NY (US); Alan Thomas, Hopewell Junction, NY (US); Daniel Sanders, San Jose, CA (US); Dario Goldfarb, Dobbs Ferry, NY (US); Nelson Felix, Slingerlands, NY (US); Chi-Chun Liu, Altamont, NY (US); John Arnold, North Chatham, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/145,143

(22) Filed: Sep. 27, 2018

(65) Prior Publication Data

US 2020/0105628 A1    Apr. 2, 2020

(51) Int. Cl.
*H01L 21/00* (2006.01)
*H01L 21/66* (2006.01)
*H01L 21/02* (2006.01)
*H01L 21/311* (2006.01)

(52) U.S. Cl.
CPC ........ *H01L 22/26* (2013.01); *H01L 21/02118* (2013.01); *H01L 21/02282* (2013.01); *H01L 21/31127* (2013.01)

(58) Field of Classification Search
CPC ............ H01L 22/26; H01L 21/02118; H01L 21/02282; H01L 21/31127
See application file for complete search history.

(56) References Cited

U.S. PATENT DOCUMENTS

| | | | |
|---|---|---|---|
| 4,839,311 A | 6/1989 | Riley | |
| 5,871,658 A | 2/1999 | Tao | |
| 6,180,422 B1 | 1/2001 | Li | |
| 6,258,497 B1 | 7/2001 | Kropp | |
| 6,406,924 B1 | 6/2002 | Grimbergen | |
| 6,511,920 B2 | 1/2003 | Nguyen | |
| 7,601,641 B1 | 10/2009 | Geiss et al. | |
| 7,808,651 B2 | 10/2010 | Lian | |
| 8,263,496 B1 | 9/2012 | Wodecki | |
| 9,240,359 B2 | 1/2016 | Lian | |
| 9,514,942 B1 * | 12/2016 | Smith | ............... H01L 21/28123 |
| 9,632,408 B1 * | 4/2017 | Cottle | ................... H01L 21/302 |
| 9,640,371 B2 | 5/2017 | Kabouzi | |
| 2003/0119215 A1 | 6/2003 | Petrucci | |
| 2005/0042523 A1 | 2/2005 | Wu | |
| 2012/0244458 A1 * | 9/2012 | Luong | ................. H01L 21/0337 430/5 |
| 2013/0109112 A1 | 5/2013 | Grimbergen | |

* cited by examiner

*Primary Examiner* — Richard A Booth
(74) *Attorney, Agent, or Firm* — L. Jeffrey Kelly; Otterstedt, Wallace & Kammer, LLP

(57) ABSTRACT

An exemplary semiconductor wafer includes a lower sublayer of a first organic planarization layer (OPL) material; an upper sublayer of a second OPL material deposited onto the lower sublayer; and a detectable interface between the lower sublayer and the upper sublayer. The exemplary wafer is fabricated by depositing the lower sublayer; curing the lower sublayer; and after curing the lower sublayer, depositing the upper sublayer directly onto the lower sublayer.

13 Claims, 6 Drawing Sheets

US 10,748,823 B2

EMBEDDED ETCH RATE REFERENCE LAYER FOR ENHANCED ETCH TIME PRECISION

BACKGROUND

The present invention relates to semiconductor fabrication, and more specifically, to controlling etch of layers during semiconductor fabrication.

An organic planarization layer (OPL) is mostly used for back end of line (BEOL) processes such as tri-layer for patterning, but also for planarization layer or etch back. Commonly, the OPL is etched entirely, and laser spectrometry reflectometry (LSR) or optical emission spectroscopy (OES) can be used for endpoint detection of the OPL etch. It is generally easy to detect removal of an entire layer because different materials provide a clear transition in plasma color and in reflected wavelength.

SUMMARY

Principles of the invention provide techniques for an embedded etch rate reference layer for enhanced etch time precision. In one aspect, an exemplary method includes depositing a lower sublayer of a first organic planarization layer (OPL) material; curing the lower sublayer; after curing the lower sublayer, forming a detectable interface on the lower sublayer by depositing and curing an upper sublayer of a second OPL material directly onto the lower sublayer; etching the upper sublayer in a process chamber while monitoring a signal that is indicative of a chemical composition of a plasma within the process chamber; detecting in the signal a discernible peak that corresponds to the detectable interface; and modulating at least one etch process parameter, in response to detecting the discernible peak.

In another aspect, an exemplary semiconductor wafer includes a lower sublayer of a first organic planarization layer (OPL) material; an upper sublayer of a second OPL material deposited onto the lower sublayer; and a detectable interface formed by contact of the lower sublayer with the upper sublayer. The detectable interface is configured such that, during etching of the wafer in a process chamber, etching of the detectable interface produces a discernible peak in a signal that is indicative of a chemical composition of a plasma within the process chamber.

In some aspects, the first and second OPL materials are a same material.

In view of the foregoing, techniques of the present invention can provide substantial beneficial technical effects. For example, one or more embodiments provide one or more of:

Adjustment of etch rate and/or etch depth based on correlating optical signal data with known position of embedded etch rate reference layer, thereby enabling accurate and precise partial removal of an organic planarization later, leaving a residual portion of desired depth.

Enhanced precision of etch time for organic planarization layer (OPL) and subsequent layers.

A robust marker for monitoring and adjusting the etch plasma characteristics.

A robust marker for detecting variation in etch process variables.

These and other features and advantages of the present invention will become apparent from the following detailed description of illustrative embodiments thereof, which is to be read in connection with the accompanying drawings.

DETAILED DESCRIPTION

Figure 1:
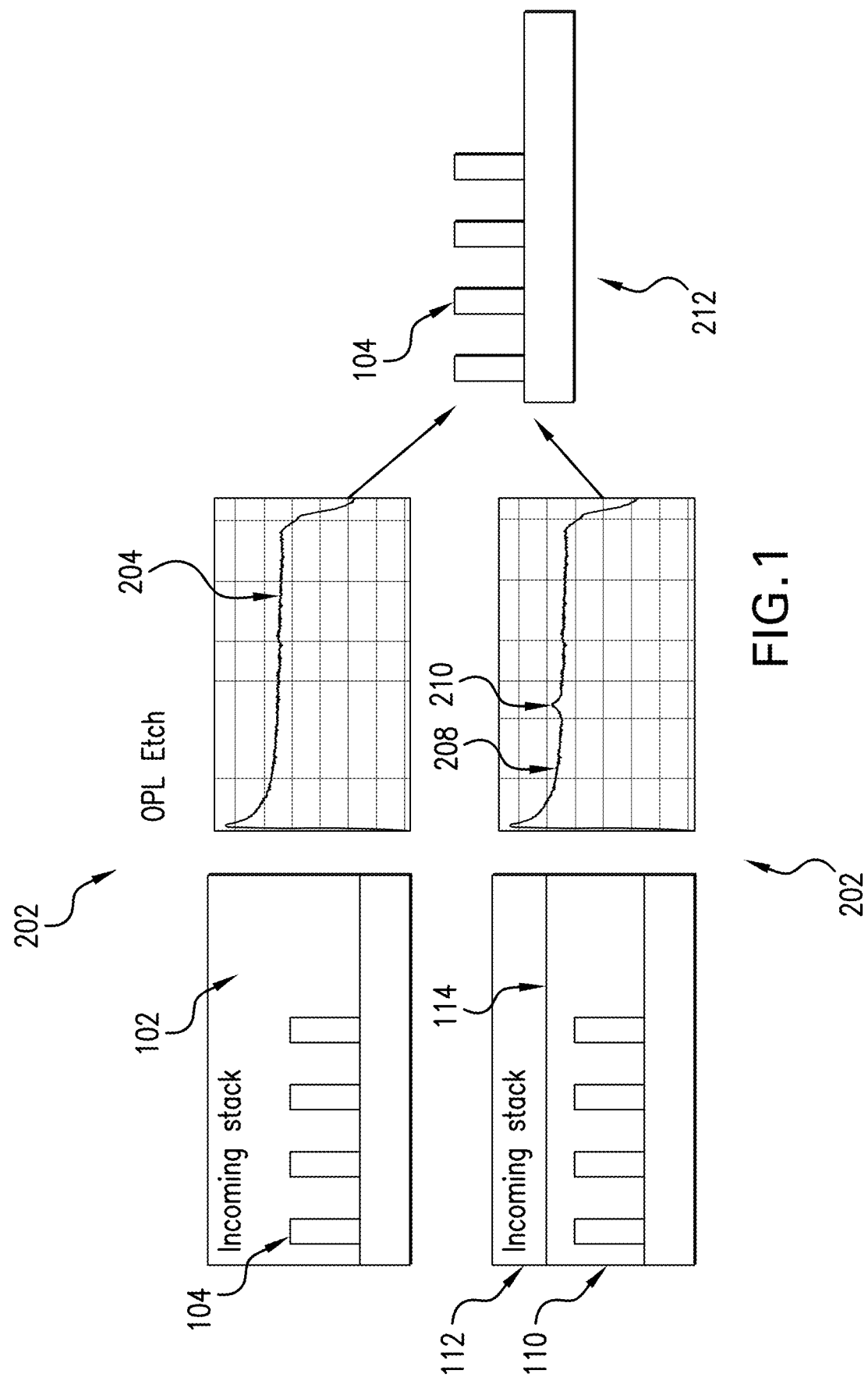
FIG. 1 depicts OES responses for two different etch processes on two distinct OPL structures.

It may be desirable to only partially etch the OPL and/or be able to change etch OPL chemistry, for example, in order to avoid using an oxidizing OPL etch plasma with an exposed metallic element (this would risk re-oxidation of the metal that could be removed by subsequent wet process). Thus, when removing the OPL using oxygen plasma to increase throughput, it is advantageous to be able to stop the etch and retain a partial OPL as a protective mask to prevent removal or damage of an underlying metal layer. Alternatively, it is helpful to have a benchmark that permits changing the OPL etch plasma chemistry before the OPL has been completely removed, then continuing to remove the OPL using an etch plasma chemistry that is compatible with underlying metal (non-oxidizing).

Advantageously, embodiments of the invention provide an etch rate reference layer that enables enhanced etch time precision for the OPL, so that partial etching/chemistry modulation can be accomplished with repeatability. The etch rate reference layer(s) are produced by depositing multiple sublayers of OPL to create an interface that can be detected for the endpoint of a partial etch. The interface can be detected by monitoring a signal indicative of process chamber plasma chemistry, e.g., an OES or LSR signal. This is advantageous because it permits detection of the interface after partial removal of an OPL. By contrast, previous techniques would not produce a discernible change in OES or LSR signal until complete removal of the OPL.

The sublayers can be deposited of identical or different OPL materials or thickness. Even when the same material is used for multiple sublayers, in one or more embodiments, the use of multiple layers permits detection due to presence of an interlayer interface. In one or more embodiments, the interlayer interface is produced by curing a lower sublayer before depositing an upper sublayer on top of the lower sublayer. For example, cure of the lower sublayer can be accomplished by removing the wafer from the deposition equipment between the lower sublayer deposition and the upper sublayer deposition. There is then a "queue time" between the different sublayers, which permits time for the lower sublayer to cure. Advantageously, one or more embodiments provide that the multiple sublayers are not deposited in situ at the same time. On the other hand, given appropriate process equipment, it is possible to accomplish certain embodiments without removing a wafer from a process chamber. By providing for cure of the lower sublayer before deposition of the upper sublayer, a detectable interface is created.

An exemplary deposition process for an OPL starts at relatively low temperature (e.g., 50 to 200 degrees Celsius) to allow the OPL to reflow (planarization), then increases the temperature (e.g., to within a range from about 120 to about 400 degrees Celsius) to cause cross linking (cure). Temperature for each step is defined based on the OPL material. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. Process times are usually around one minute for each sequence. An ordinary skilled worker will appreciate that a cure is "complete" when the OPL monomers have cross linked to effect a significant change in mechanical properties of the OPL, however, a complete cure is not needed in order to provide a detectable interface. Thus, one or more embodiments cure the lower sublayer of the OPL at least enough to produce the detectable interface. Notably, a detectable interface can be produced by repeating the deposition process for a lower sublayer and then for an upper sublayer with minimal intervening queue time.

Pertinent aspects of one or more embodiments are directed to techniques for detecting the transition between the sublayers. Detecting sublayer transitions can enable real time detection for advanced process control (APC) in situ and ex-situ: monitoring etch rate of the tool and or incoming OPL thickness. Advantageously, by changing etch rate or other common parameters such as pressure, temperature, gas flow rate or gas mixture, radio frequency (RF) power, it is possible to modulate the time for subsequent etch processes of other materials. Additionally, it is advantageous to control the etch rate of the OPL in order to etch most of the OPL but then leave a partial layer of the OPL with precise control of residual thickness, so as to protect any underlying metal layer from inadvertent oxidation by the OPL etch plasma or use this partial OPL layer to act as an additional mask for subsequent process sequences.

FIG. 1 depicts OES responses for the same etch processes on two distinct OPL structures. At the top of FIG. 1, a process 202 proceeds from left to right starting at time zero. At the start of the process 202 (time zero), a single layer of OPL material 102 is present over a substrate, which may for example be patterned with fin precursors 104. An OES response 204 remains essentially flat as the OPL 102 is etched, then drops off sharply when all of the OPL has been removed. At the bottom of FIG. 1, the same etch process 202 is demonstrated beginning from two sublayers of OPL, a lower sublayer 110 and an upper sublayer 112, with an interface 114 between the sublayers. The interface 114 can be formed, in one or more embodiments, by depositing the lower sublayer 110, curing the lower sublayer, and then depositing the upper sublayer 112 with adequate final curing of the final stack. In one or more embodiments, curing the lower sublayer 110 includes waiting for a cure time that is sufficient for a complete cure, according to the exemplary process discussed above. Referring to the lower portion of FIG. 1, to the right of the exemplary starting structure 110, 112, 114, an OES response 208 remains substantially flat as the upper sublayer 112 is etched, then exhibits a discernible peak 210 as the etch reaches the interface 114 between the sublayers 110, 112. The OES response 208 then again remains substantially flat after the interface has been etched, and drops off sharply after the lower sublayer 110 has been fully removed. The peak 210 in the OES response 208 permits detection of the transition at the interface 114 between the OPL sublayers 110 and 112, which in turn enables precise tuning of the subsequent etch process to control how to manage the lower OPL sublayer 110. Regardless whether the process 202 begins from the single monolithic OPL 102 or from the multiple OPL sublayers 110 and 112, it produces the same final structure 212, however, when the process 202 begins from the multilayer OPL 110 and 112 it can be halted at the interface 114 that corresponds to the OES signal peak 210 if desired, thereby leaving residual OPL sublayer 112 with a precisely controlled thickness.

Figure 2:
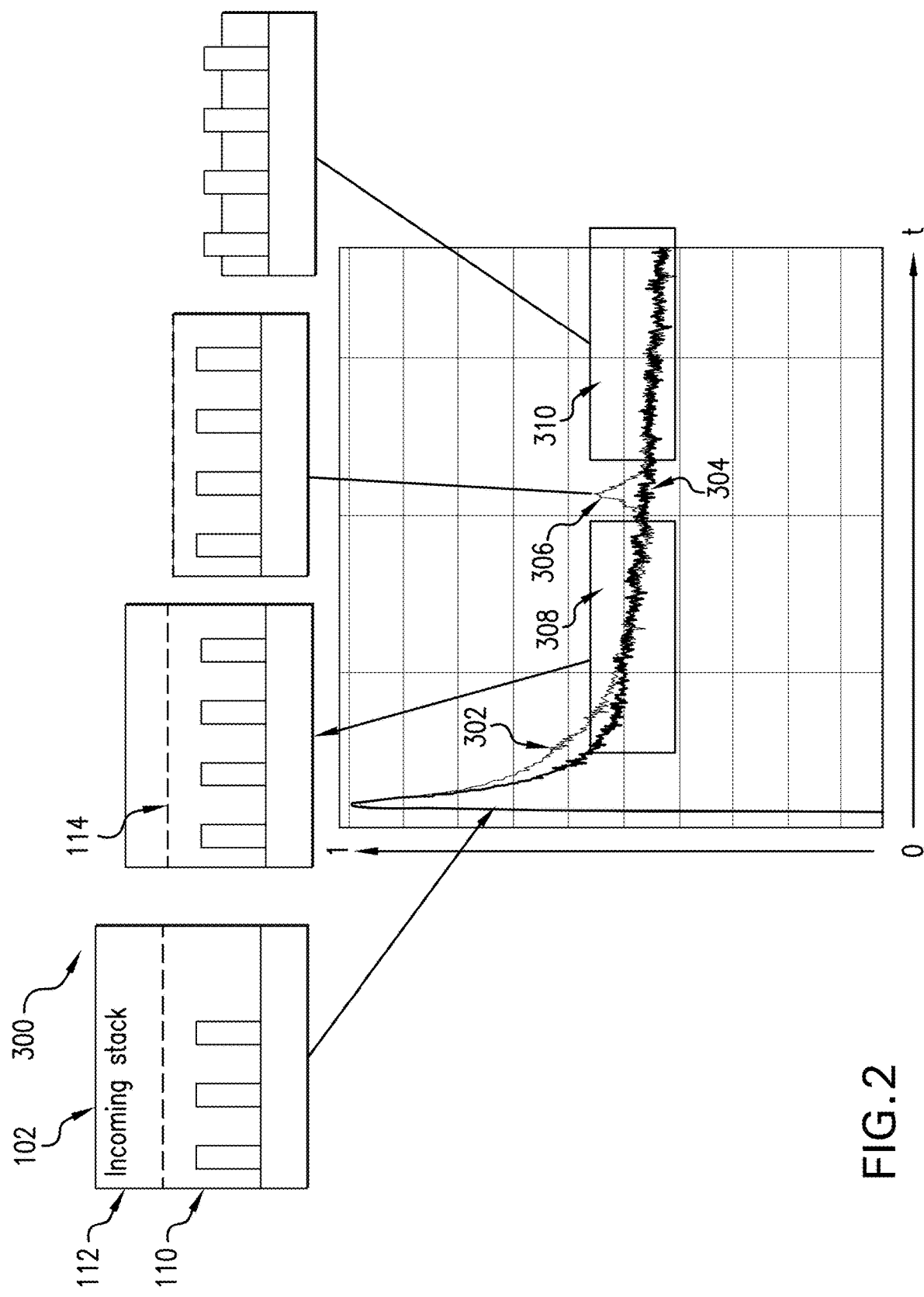
FIG. 2 depicts a demonstration of OES signals for step-by-step etching of a composite OPL stack, according to an exemplary embodiment, compared to etching of a monolithic OPL stack.

FIG. 2 depicts a demonstration of OES signals for step-by-step etching of a composite OPL stack compared to etching of a monolithic OPL stack. At the top left of FIG. 2, an initial structure 300 comprises an OPL 102 with lower and upper sublayers 110, 112 that define an interface 114 created by two successive operations of OPL deposition with intermediate cure of the lower sublayer 110 and a final cure of the stack after deposition of the upper sublayer 112. During etch of the structure 300, a first OES signal 302 is produced. By comparison, a second OES signal 304 is shown relative to etching of a second initial structure (not shown) that incorporates a monolithic or single layer OPL. The first OES signal 302 includes a discernible peak 306 that corresponds to when the etch process reaches the interface 114. An ordinary skilled worker in the field of semiconductor plasma etch will be familiar with how to detect or discern a peak in an OES signal that corresponds to a change in the material being etched. During a first interval 308 preceding the peak 306, the first and second OES signals 302, 304 are substantially the same during etching of the OPL (above the interface in the case of the sample with the interface); during a second interval 310 following the peak 306 the first and second OES signals 302, 304 again are substantially the same during etching of the OPL (below the interface in the case of the sample with the interface).

Figure 3:
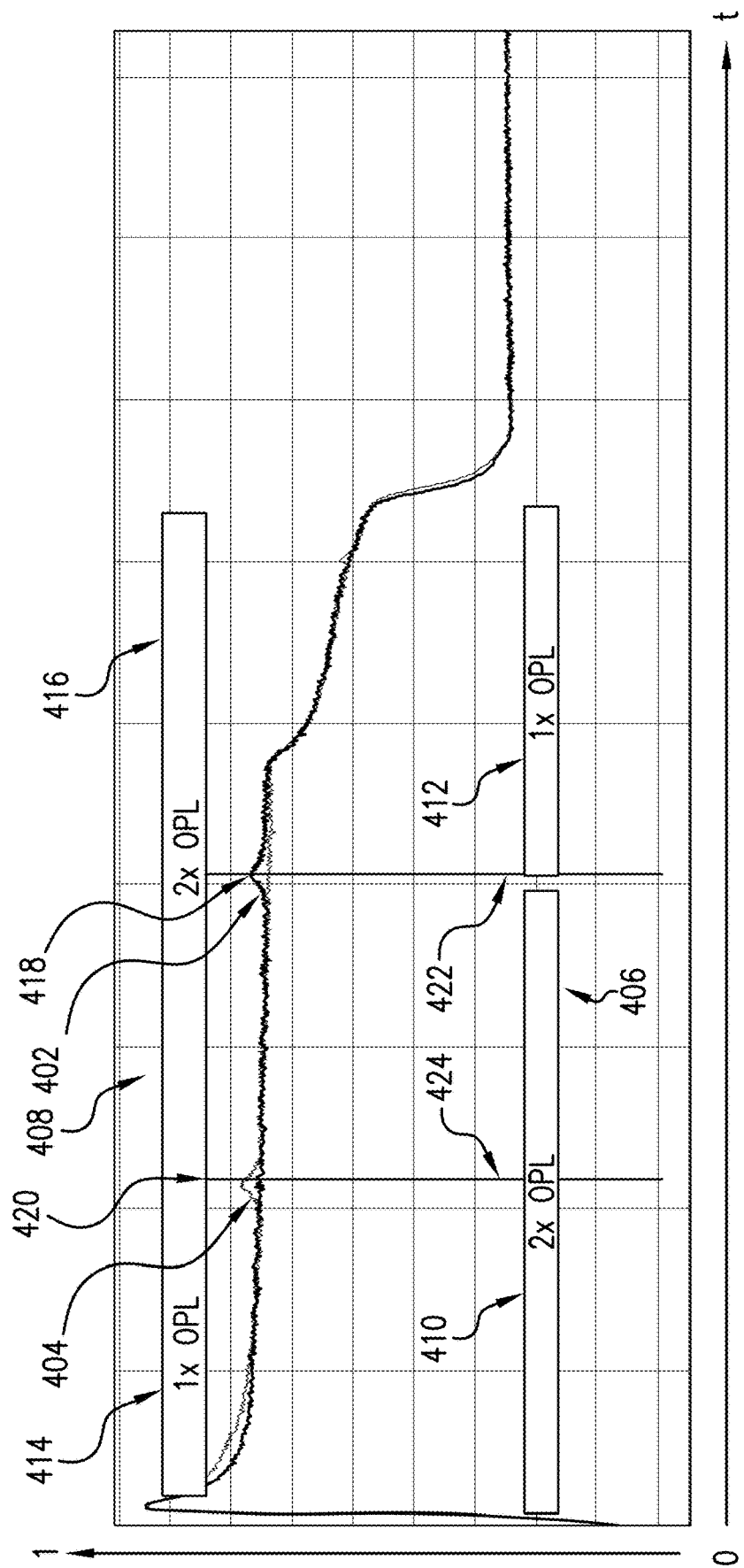
FIG. 3 depicts yet another demonstration of OES signals from etching two different wafer structures, according to yet another exemplary embodiment.

FIG. 3 depicts another demonstration of OES signals 402, 404 from etching two different wafer structures 406, 408. The first wafer structure 406 has an upper OPL sublayer 410 of 2× thickness and a lower OPL sublayer 412 of 1× thickness, and is fabricated from a first OPL material. The second wafer structure 408 has an upper OPL sublayer 414 of 1× thickness and a lower OPL sublayer 416 of 2× thickness, and is deposited from the same first OPL material. For both structures 406 and 408, the deposition processes include curing the lower sublayers before depositing the upper sublayers, and accordingly, the respective OES signals 402 and 404 include discernible peaks 418 and 420 that correspond to the interfaces 422 and 424 between upper and lower OPL sublayers.

Figure 4:
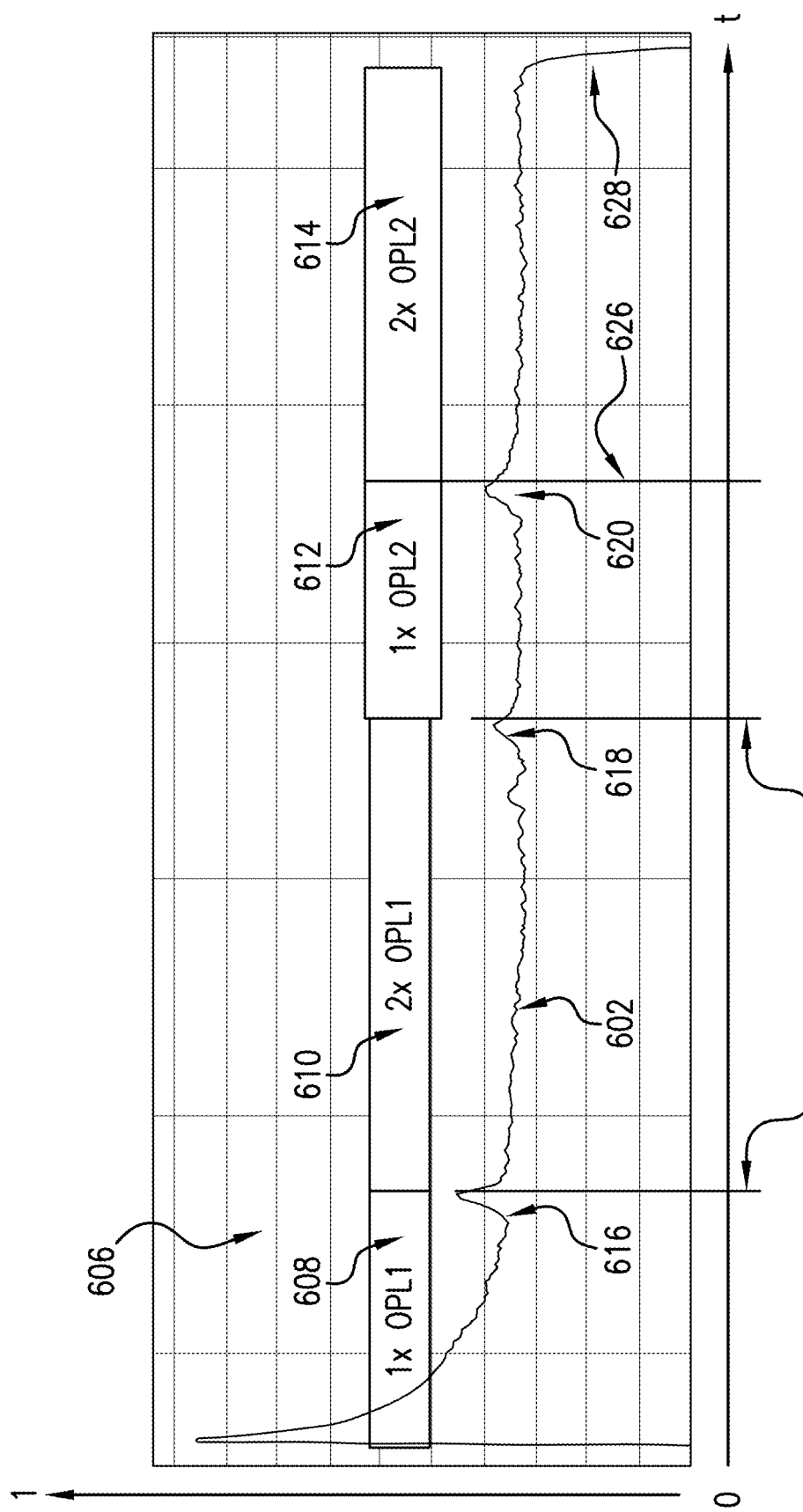
FIG. 4 depicts a demonstration of OES signals that are produced by etching a wafer structure that comprises first, second, third, and fourth OPL sublayers, according to an exemplary embodiment.

FIG. 4 depicts an OES signal 602 that is produced by etching a wafer structure 606 that comprises first, second, third, and fourth OPL sublayers 608, 610, 612, 614. The first OPL sublayer 608 is fabricated from a first OPL material "OPL1" and is of 1× thickness. The second OPL sublayer 610 is fabricated from the first OPL material "OPL1" and is of 2× thickness. The third OPL sublayer 612 is fabricated from a second OPL material "OPL2", different from the first OPL material, and is 1× thick. The fourth OPL sublayer 614 is fabricated from the second OPL material "OPL2" and is 2× thick. The signal 602 indicates peaks 616, 618, 620 corresponding to etching of interfaces 622, 624, 626 between the various OPL sublayers, and indicates a drop off 628 after complete etch of the OPL.

One or more embodiments produce a detectable layer interface for measuring and calibrating etch rate, even when using the same material in both layers that form the interface, by curing a first-deposited (lower) layer before depositing a second (upper) layer. Alternatively, different materials can be used for the two layers that form the interface;

clarity of the signal produced during etching the interface still is enhanced by curing the lower layer before depositing the upper layer.

Figure 5:
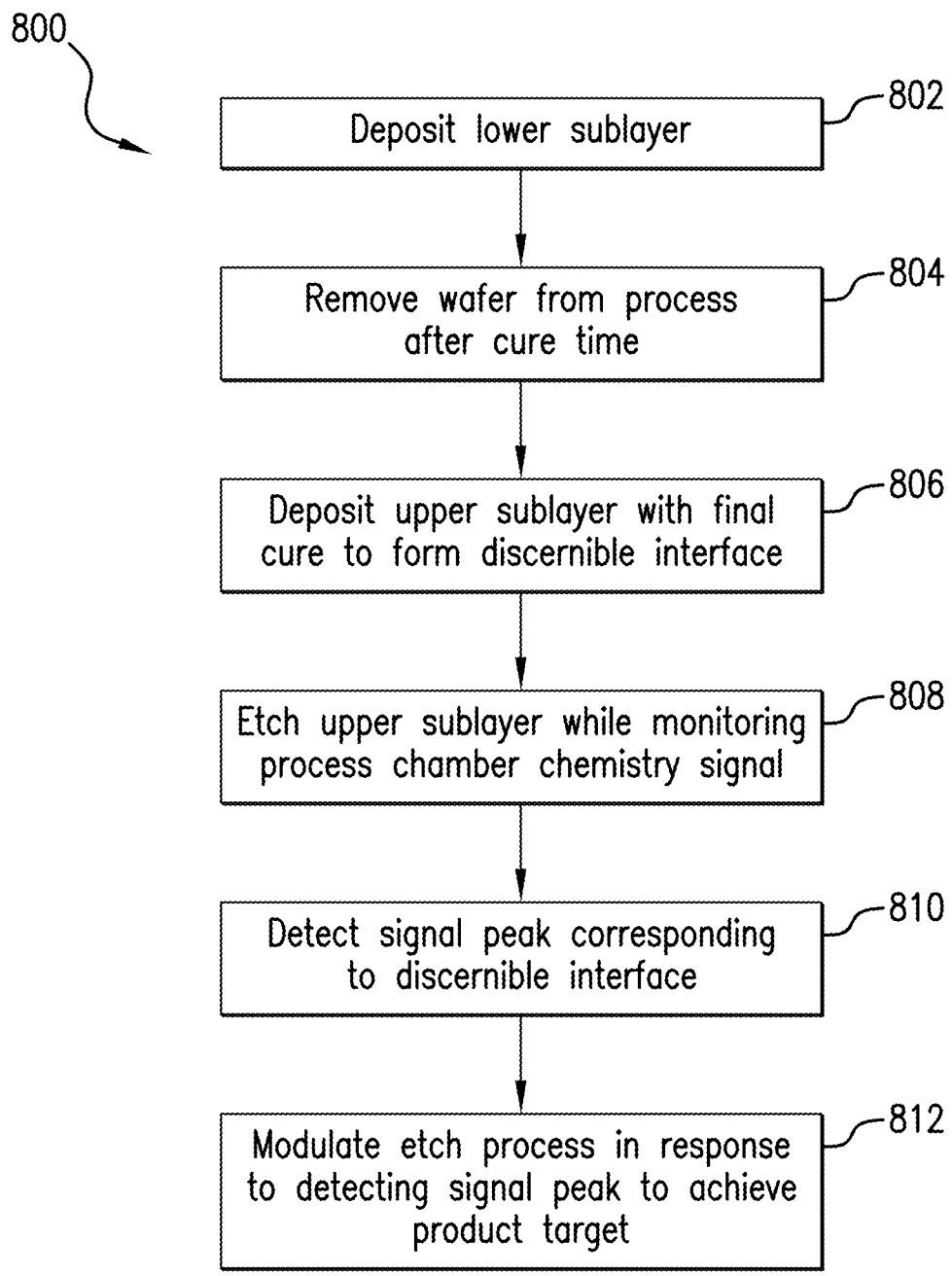
FIG. 5 depicts a method for enhancing etch time precision based on use of an embedded etch rate reference layer, according to an exemplary embodiment.

Thus, FIG. 5 depicts a method 800 for enhancing etch time precision based on use of an embedded etch rate reference layer. At step 802, deposit a lower sublayer of OPL material. At step 804, remove the wafer from the deposition process and cure the lower sublayer. At step 806, deposit and cure an upper sublayer of OPL material onto the (cured) lower sublayer to define a detectable interface between the lower sublayer and the upper sublayer. At step 808, etch the upper sublayer while monitoring an OES signal. At step 810, detect an OES signal peak corresponding to the detectable interface. At step 812, modulate the etch process chemistry or RF power, in response to detecting the OES signal peak, thereby halting or altering the etch rate in a manner understood by the skilled worker; alternatively, continue the etch process to a future endpoint (complete removal of the OPL).

It is worth noting that some prior-art approaches are carried out in situ with two different types of films (spin-on and chemical vapor deposition (CVD)). These prior art approaches modify the chemistry during deposition; e.g., layer A/layer B/layer A/layer B. In contrast, one or more embodiments use the same material in both layers and process it to obtain the interface. Note that some embodiments use different brands of OPL from different suppliers for the multiple layers. Thus, in one or more embodiments, adjacent layers of the same OPL can be made or a "sandwich" of different brands of OPL from different suppliers with different compositions can be used. In one or more embodiments, even when using different brands of OPL, all layers are organic and the wafer is removed from the process equipment between coats for curing. Some embodiments use a spin-on organic planarization layer. Thus, to reiterate, in one or more embodiments, the first coat of OPL is allowed to fully cure before the next layer is applied. An ordinary skilled worker will appreciate how to determine that a layer of OPL is fully or completely cured. Some embodiments use the same OPL in each layer; some embodiments use OPL in each layer but use different compositions of OPL in each layer. Indeed, one or more embodiments provide a multi-sequence ex-situ deposition of the same organic multi-layer with specific heights to enable a detection to correlate with an Etch rate and/or etch depth.

It is also worth noting that the skilled artisan will be familiar with prior-art techniques for endpoint detection such as optical detection by visual human observation; use of a spectrometer; use of an LSR—Interferometer; use of an RGA (Residual Gas Analyzer—mass spectrometer); VPP (plasma potential) using wafer impedance; and the like.

Given the discussion thus far, it will be appreciated that, in general terms, an exemplary method, according to an aspect of the invention, includes depositing onto a wafer a lower sublayer of a first organic planarization layer (OPL) material; curing the lower sublayer; after curing the lower sublayer, forming a detectable interface on the lower sublayer by depositing and curing an upper sublayer of a second OPL material directly onto the lower sublayer; etching the upper sublayer in a process chamber while monitoring a signal that is indicative of a chemical composition of a plasma within the process chamber; detecting in the signal a discernible peak that corresponds to the detectable interface; and modulating at least one etch process parameter, in response to detecting the discernible peak. In one or more embodiments, modulating at least one etch process parameter includes flushing a plasma from the process chamber with an inert gas. In one or more embodiments, modulating at least one etch process parameter includes reducing a concentration of an oxidizing component of a plasma.

In one or more embodiments, the first and second OPL materials are a same material.

In one or more embodiments, the exemplary method further includes, after curing the upper sublayer, depositing and curing a subsequent sublayer of a third OPL material onto the upper sublayer.

In one or more embodiments, the first, second, and third OPL materials are a same material.

In one or more embodiments, curing the lower sublayer includes waiting for a cure time that is sufficient for a complete cure of the lower sublayer.

In one or more embodiments, the first OPL material and the second OPL material are deposited onto the wafer by spin-on processes.

In another aspect, a semiconductor wafer includes a lower sublayer of a first organic planarization layer (OPL) material; an upper sublayer of a second OPL material deposited directly onto the lower sublayer; and a detectable interface formed by contact of the lower sublayer with the upper sublayer. The detectable interface is configured such that, during etching of the wafer in a process chamber, etching of the detectable interface produces a discernible peak in a signal that is indicative of a chemical composition of a plasma within the process chamber.

In one or more embodiments, the first and second OPL materials are a same material.

In one or more embodiments, the first OPL material and the second OPL material are deposited onto the wafer by spin-on processes.

In one or more embodiments, the detectable interface is produced by: depositing the lower sublayer of the first OPL material; curing the lower sublayer; and after curing the lower sublayer, depositing the upper sublayer of the second OPL material onto the lower sublayer. In one or more embodiments, curing the lower sublayer includes waiting for a cure time that is sufficient for a complete cure of the lower sublayer.

In one or more embodiments, the exemplary semiconductor wafer further includes a subsequent sublayer of a third OPL material deposited and cured onto the upper sublayer; and a second detectable interface between the upper sublayer and the subsequent sublayer. In one or more embodiments, the first, second, and third OPL materials are a same material. In one or more embodiments, the second detectable interface is produced by curing the upper sublayer, and after curing the upper sublayer, depositing the subsequent sublayer onto the upper sublayer.

Figure 6:
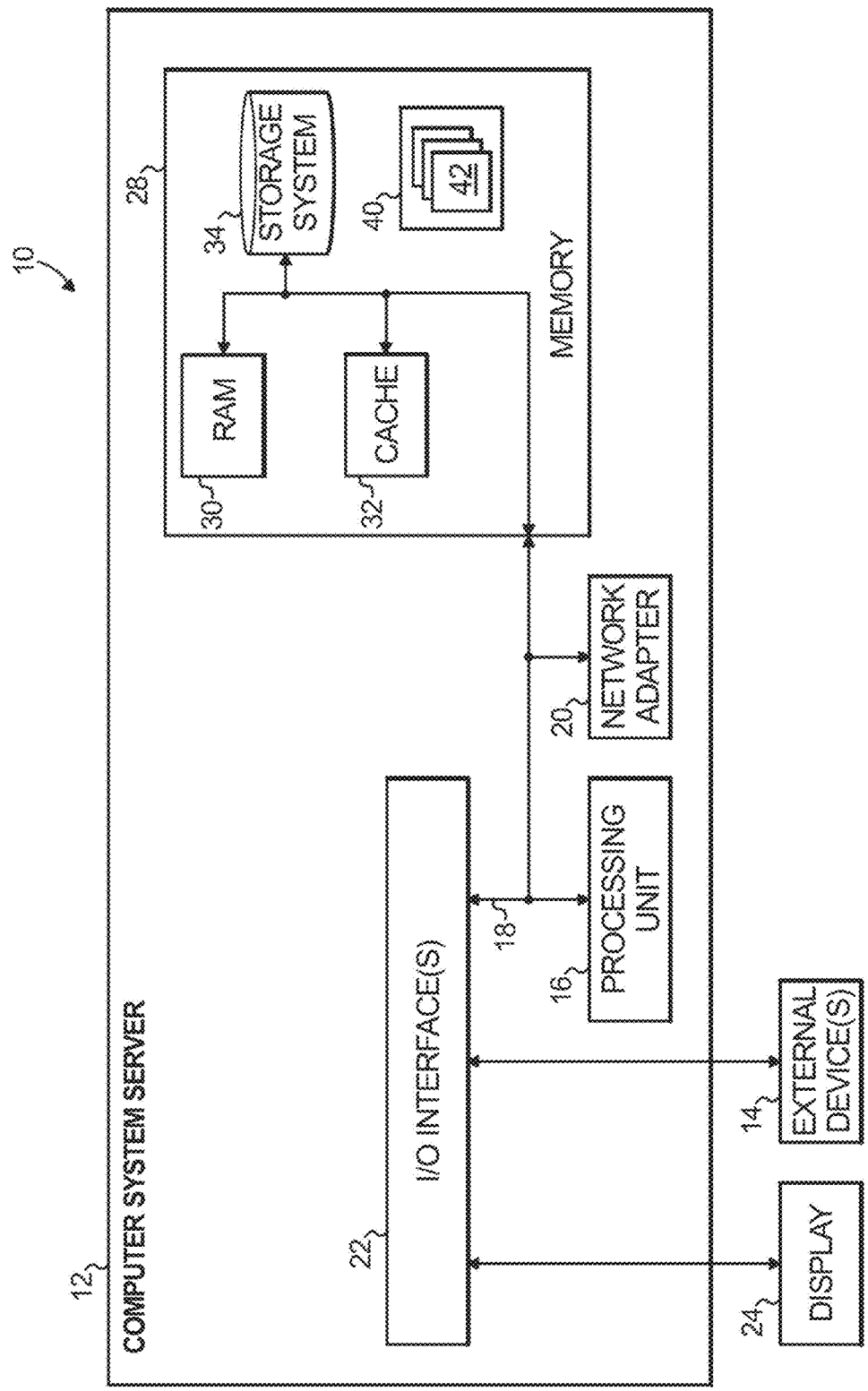
FIG. 6 depicts a computer system that may be useful in implementing one or more aspects and/or elements of the invention.

One or more embodiments of the invention, or elements thereof, can be implemented in the form of an apparatus including a memory and at least one processor that is coupled to the memory and operative to perform exemplary method steps, or in the form of a non-transitory computer readable medium embodying computer executable instructions which when executed by a computer cause the computer to perform exemplary method steps. FIG. 6 depicts a computer system that may be useful in implementing one or more aspects and/or elements of the invention.

In system 10 there is a computer server 12, which is operational with numerous other general purpose or special purpose computing system environments or configurations. Examples of well-known computing systems, environments, and/or configurations that may be suitable for use with computer server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer server 12 may be described in the general context of computer system executable instructions, such as program modules, being executed by a computer system. Generally, program modules may include routines, programs, objects, components, logic, data structures, and so on that perform particular tasks or implement particular abstract data types. Computer server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 6, computer server 12 in system 10 is shown in the form of a general-purpose computing device. The components of computer server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer server 12 typically includes a variety of computer system readable media. Such media may be any available media that is accessible by computer server 12, and it includes both volatile and non-volatile media, removable and non-removable media.

System memory 28 can include computer system readable media in the form of volatile memory, such as random access memory (RAM) 30 and/or cache memory 32. Computer server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer server 12 may also communicate with one or more external devices 14 such as semiconductor fabrication process equipment in accordance with aspects of the invention. Computer server 12 also may communicate with a display 24, etc.; one or more devices that enable a user to interact with computer server 12; and/or any devices (e.g., network card, modem, etc.) that enable computer server 12 to communicate with one or more other computing devices. Such communication can occur via Input/Output (I/O) interfaces 22. Still yet, computer server 12 can communicate with one or more networks such as a local area network (LAN), a general wide area network (WAN), and/or a public network (e.g., the Internet) via network adapter 20. As depicted, network adapter 20 communicates with the other components of computer server 12 via bus 18. It should be understood that although not shown, other hardware and/or software components could be used in conjunction with computer server 12. Examples include, but are not limited to: microcode, device drivers, redundant processing units, and external disk drive arrays, RAID systems, tape drives, and data archival storage systems, etc.

Thus, one or more embodiments can make use of software running on a general purpose computer or workstation. With reference to FIG. 6, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 6) running a server program. It will be understood that such a physical server may or may not include a display and keyboard.

One or more embodiments can be at least partially implemented in the context of a cloud or virtual machine environment, although this is exemplary and non-limiting.

It should be noted that any of the methods described herein can include an additional step of providing a system comprising distinct software modules embodied on a computer readable storage medium; the modules can include, for example, any or all of the appropriate elements depicted in the block diagrams and/or described herein; by way of example and not limitation, any one, some or all of the modules/blocks and or sub-modules/sub-blocks described. The method steps can then be carried out using the distinct software modules and/or sub-modules of the system, as described above, executing on one or more hardware processors such as 16. Further, a computer program product can include a computer-readable storage medium with code adapted to be implemented to carry out one or more method steps described herein, including the provision of the system with the distinct software modules.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    depositing onto a wafer a lower sublayer of a first organic planarization layer (OPL) material;
    curing the lower sublayer;
    after curing the lower sublayer, forming a detectable interface on the lower sublayer by depositing and curing an upper sublayer of a second OPL material directly onto the lower sublayer;
    etching the upper sublayer in a process chamber while monitoring a signal that is indicative of a chemical composition of a plasma within the process chamber;
    detecting in the signal a discernible peak that corresponds to the detectable interface; and
    modulating at least one etch process parameter, in response to detecting the discernible peak.

2. The method of claim 1, wherein the first and second OPL materials are a same material.

3. The method of claim 1, further comprising, after curing the upper sublayer, depositing and curing a subsequent sublayer of a third OPL material onto the upper sublayer.

4. The method of claim 3, wherein the first, second, and third OPL materials are a same material.

5. The method of claim 1, wherein curing the lower sublayer includes waiting for a cure time that is sufficient for a complete cure of the lower sublayer.

6. The method of claim 1, wherein the first OPL material and the second OPL material are deposited onto the wafer by spin-on processes.

7. The method of claim 1, wherein modulating at least one etch process parameter includes flushing a plasma from the process chamber with an inert gas.

8. The method of claim 1, wherein modulating at least one etch process parameter includes reducing a concentration of an oxidizing component of a plasma.

9. A non-transitory computer readable medium embodying computer executable instructions which when executed by at least one processor cause the at least one processor to control process equipment to carry out the method of:
    depositing a lower sublayer of a first organic planarization layer (OPL) material;
    curing the lower sublayer;
    after curing the lower sublayer, forming a detectable interface on the lower sublayer by depositing and curing an upper sublayer of a second OPL material directly onto the lower sublayer;
    etching the upper sublayer in a process chamber while monitoring a signal that is indicative of a chemical composition of a plasma within the process chamber;
    detecting in the signal a discernible peak that corresponds to the detectable interface; and
    modulating at least one etch process parameter, in response to detecting the discernible peak.

10. The medium of claim 9, wherein the method further comprises curing the upper sublayer, and after curing the upper sublayer, depositing a subsequent sublayer of a third OPL material onto the upper sublayer.

11. The medium of claim 9, wherein the lower sublayer and the upper sublayer are deposited onto a wafer by spin-on processes.

12. The medium of claim 9, wherein modulating at least one etch process parameter includes flushing a plasma from the process chamber with an inert gas.

13. The medium of claim 9, wherein modulating at least one etch process parameter includes reducing a concentration of an oxidizing component of a plasma.

* * * * *